Sept. 12, 1950 S. H. M. DODINGTON ET AL 2,521,700
OSCILLATOR CONTROL SYSTEM
Filed March 9, 1946
Fig. 1.
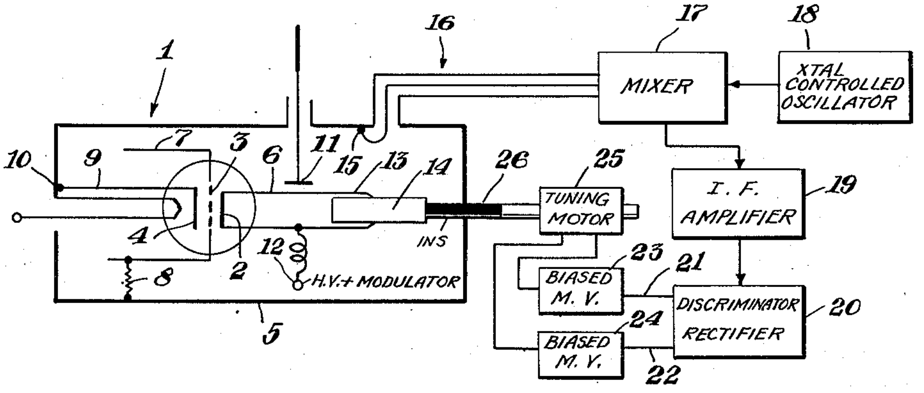
Fig. 2.
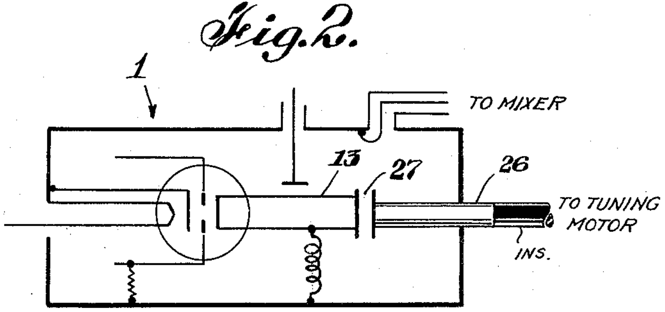
Fig. 3. Fig. 4.
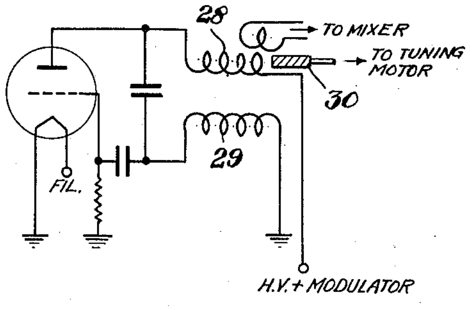
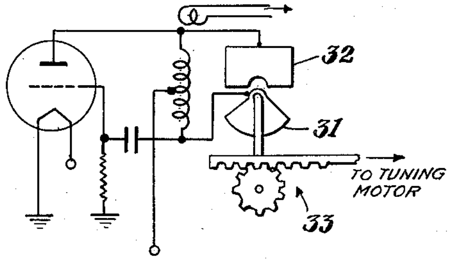
INVENTORS
SVEN H. M. DODINGTON
JOHN A. HERBST
BY
R P Morris
ATTORNEY Patented Sept. 12, 1950

2,521,700

UNITED STATES PATENT OFFICE 2,521,700

OSCILLATOR CONTROL SYSTEM

Sven H. M. Dodington, Nutley, and John A. Herbst, Pines Lake, N. J., assignors to Federal Telephone and Radio Corporation, New York, N. Y., a corporation of Delaware Application March 9, 1946, Serial No. 653,267

10 Claims. (Cl. 250—36)

This invention relates to oscillator circuits and more particularly to a novel circuit for automatically controlling and maintaining constant the frequency of an ultra high frequency oscillator.

Radio transmitters are generally required to maintain an accurate transmission frequency. This control of the transmitter frequency has in the past been obtained by the use of quartz crystals. At the higher frequencies, however, the problem of multiplication combined with power amplification becomes rather complicated, particularly, which frequencies in the range of a thousand megacycles, a power amplifier is not a simple matter.

It is an object of the present invention to provide a frequency control for an oscillator which avoids the necessity of multiplication with power amplification.

It is an object of the present invention to provide a frequency control for an oscillator of the type herein referred to wherein the oscillator frequency is compared to a crystal oscillator frequency and the information thus obtained is used to control the oscillator frequency.

In accordance with the invention we provide in connection with a high frequency oscillator a crystal controlled beat frequency oscillator to obtain an intermediate frequency by beating the frequencies of the two oscillators. The resulting intermediate frequency is applied to a balance type discriminator circuit wherein deviations from a given mean are used to operate a motor in either direction for tuning the main oscillator to compensate for any deviations from the desired constant frequency.

These and other features and objects of the invention will become more apparent upon consideration of the following detailed description to be read in connection with the accompanying drawings in which:

Fig. 1 is a representation partly in block form of an oscillator frequency control in accordance with our invention; and Figs. 2, 3 and 4 are illustrations of alternative oscillator circuits which may be controlled in accordance with the invention.

Referring to the oscillator in Fig. 1, a lighthouse tube oscillator is shown at 1 comprised of a triode including a plate 2, a grid 3 and a cathode 4. The electrodes are connected to form an oscillating circuit in the conventional manner, a cavity resonator being indicated at 5 to which the plate 2 is coupled by means of a suitable plate line 6 extending within the cavity. A feed-back is established between the plate grid circuit including the grid 3 and a grid bell or skirt 7 which latter is grounded over a resistor 8 to the resonator 5, and the grid cathode circuit including grid skirt 7, cathode 4 through the resonator cavity. A capacitative take-off coupling to the plate circuit 6 is shown at 11. The plate circuit 6 has a connection at 12 for the injection thereon of the D. C. plate potential and modulation voltages and at 13 it is shown provided with a plate circuit tuning element 14 such as a stud which may be pushed in and out to change the length of the plate line to effect a corresponding tuning of the plate circuit. A portion of the oscillating energy may be picked up by the coupling loop 15 disposed within the cavity and by means of a connection 16 leading to a mixer circuit 17. The mixer circuit also receives oscillating energy from another oscillator indicated at 18 which is of the crystal controlled type and oscillating at a frequency different from that of the oscillator 1. The resultant intermediate frequency is fed from the mixer 17 into an intermediate frequency amplifier 19 whence after amplification it is applied to a discriminator circuit 20. The discriminator is of the balanced type which gives no output at the mean frequency and gives a voltage in one output lead 21 at an input frequency higher than the mean frequency and another voltage in the output lead 22 for an input frequency less than the mean frequency of the discriminator. The discriminator also incorporates a rectifier to provide a direct current output in the leads 21 and 22. The voltages available in the leads 21 and 22 are applied to multivibrators 23 and 24 respectively which are so biased as not to function unless a voltage sufficient to overcome the bias is supplied them. The output of the multivibrators is applied to a tuning motor 25 which is of such a construction as to translate the actuation thereof into a movement for shifting the element 14 longitudinally in or out in respect to the plate line 6 by means of a connecting shaft 26 in accordance with the relative application of the respective energizing voltages.

In order to reduce over-travel of the motor, a condition which will lead to the phenomenon generally known as "hunting," it is essential that any over-travel occurring after the removal of energy from the motor not exceed the frequency tolerance established for the system. Such a motor is preferably of the ratchet type, where the amount of frequency-shift per ratchet-tooth is less than the permissible frequency deviation of the system. This allows the ratchet motor to operate at a speed limited only by mechanical considerations and yet to stop instantly at a frequency setting within the prescribed tolerance.

In the embodiment of the circuit shown in Fig. 2, the oscillator is similar to the one shown in Fig. 1 except that instead of a plunger or stud type member 14 for tuning the plate circuit 13, a capacity 27 is provided which serves to vary the timing of the plate circuit by the variation in the distance between the stationary and the movable condenser plate by means of the member 26.

In the circuit of Fig. 3 a lower frequency type of oscillator is shown employing also a longitudinally movable means of control in which the plate circuit which includes an induction coil 28 and a grid circuit feed back coil 29 is shown employing a metallic magnetizable slug 30 for the tuning of the plate circuit by the adjustment of the position of said slug by means of the tuning motor. In the conventional Hartley type oscillator shown in Fig. 4, the tuning of the plate circuit is obtained by the rotation of a movable condenser plate 31, with respect to a stationary plate 32. By means of a rack and pinion mechanism 33 the condenser may be actuated by a tuning motor having a longitudinal movement of the type used in Fig. 1.

In each of the systems, Fig. 1, for instance if the main oscillator is operating at a given frequency such as 1000 megacycles and the crystal controlled oscillator is operating at another given frequency as 990 megacycles, the resulting intermediate frequency will be 10 megacycles. After being amplified and fed to the discriminator circuit 20, this intermediate frequency will result in zero output for the discriminator if such intermediate frequency remains at the 10 megacycles value. However, since the discriminator is of the balanced type it will provide a voltage, say, in the lead 21 when the resulting intermediate frequency is somewhat higher than the 10 megacycles or a voltage in the lead 22 if the resulting frequency is somewhat lower than the 10 megacycles. As a result the driving member 26 will be moved axially in or out in respect to the plate circuit 6 to tune it in accordance with the deviation from the given frequency and in accordance with the application of the energizing voltage. The operation of the other circuits shown in Figs. 2, 3 and 4 is analogous to that of Fig. 1.

The maintenance of a constant frequency of a transmitter oscillator is thus obtained by comparing the oscillator frequency to a crystal and using this information to control the transmitter oscillator frequency in accordance with the objects set forth hereinabove.

While the above is a description of the principles of this invention in connection with specific apparatus and particular modification thereof, it is to be clearly understood that this description is made only by way of example and not as a limitation on the scope of this invention.

We claim:

1. A frequency control circuit for an oscillator, comprising longitudinally movable tuning means for said oscillator, a source of constant frequency energy differing in frequency from the frequency of said oscillator, means for comparing said frequencies, means to provide output energies differing in accordance with the direction of departure of said frequencies from a given difference frequency, and separate multivibrator circuits normally inoperative and responsive to a given level of respective output energies for adjusting said tuning means.

2. A circuit according to claim 1, wherein said tuning means comprises an anode line of a cavity resonator oscillator, and means for adjusting the length of said line.

3. A circuit according to claim 1, wherein said tuning means comprises a capacitative impedance adjusting member.

4. A circuit according to claim 1, wherein said tuning means comprises an inductive impedance adjusting member.

5. A circuit according to claim 1, wherein said comparing means includes circuit means for obtaining a beat frequency signal as between said oscillator and said source.

6. A circuit according to claim 1, where said energy providing means includes a discriminator circuit of the balanced type and a biased multivibrator circuit each for supplying energy due to a positive and a negative difference in frequencies respectively.

7. A circuit according to claim 1, wherein said adjusting means comprises a motor for actuating said tuning means in either direction according to the relative difference between the two frequencies.

8. A circuit according to claim 1, wherein said adjusting means includes a motor for actuating said tuning means in a reciprocatory movement.

9. A system for controlling the frequency of an oscillator comprising an oscillator adapted to operate at a given frequency including a plate circuit, means for tuning said plate circuit, means to actuate said tuning means, a crystal controlled second oscillator adapted to operate at a constant frequency comparatively slightly different from said given frequency, mixer amplifier circuit means for obtaining an intermediate beat frequency from said two oscillators, a balanced type discriminator circuit (including rectifying means) for obtaining a respective unidirectional voltage output according to the relative difference in the frequencies of said two oscillators above and below the value of a given mean frequency, a pair of multivibrators biased to be normally inoperative, means for energizing each of said multivibrators into operation with a respective unidirectional voltage output of a given level, and means for applying the output of either of said multivibrators to said actuating means for operating the same for tuning said first oscillator in accordance with the application of said voltages thereto.

10. A frequency control system for use with an oscillator adapted to operate at a given frequency and having a plate circuit and means for tuning said plate circuit; comprising motor means adapted to effect operation of the tuning means, means to actuate said tuning means, a crystal controlled second oscillator adapted to operate at a frequency comparatively slightly different from said given frequency, mixer-amplifier circuit means for obtaining an intermediate beat frequency from said two oscillators, a balanced type discriminator circuit including rectifying means for obtaining a separate unidirectional voltage out-put according to the relative direction of departure of the difference in the frequencies of said two oscillators from a given mean frequency, a pair of multivibrators biased to be normally inoperative, means for energizing each of said multivibrators into operation with a separate voltage output above a given level, and means for applying the output of said multivibrators to said motor means for operating the same for tuning said first oscillator.

SVEN H. M. DODINGTON.
JOHN A. HERBST.

REFERENCES CITED

The following references are of record in the file of this patent:

UNITED STATES PATENTS

| Number | Name | Date |
|---|---|---|
| 2,280,019 | Alexanderssohn et al. | Apr. 14, 1942 |
| 2,294,942 | Varian et al. | Sept. 8, 1942 |
| 2,374,810 | Fremlin | May 1, 1945 |
| 2,387,544 | Usselman | Oct. 23, 1945 |
| 2,404,640 | Lawrance | July 23, 1946 |
| 2,415,141 | Malling | Feb. 4, 1947 |
| 2,434,294 | Ginzton | Jan. 13, 1948 |